United States Patent
Gras et al.

(10) Patent No.: US 11,262,427 B2
(45) Date of Patent: Mar. 1, 2022

(54) METHOD OF DESIGNING A PULSE SEQUENCE FOR PARALLEL-TRANSMISSION MRI, AND A METHOD OF PERFORMING PARALLEL-TRANSMISSION MRI USING SUCH A PULSE SEQUENCE

(71) Applicant: COMMISSARIAT A L'ENERGIE ATOMIQUE ET AUX ENERGIES ALTERNATIVES, Paris (FR)

(72) Inventors: Vincent Gras, Gif sur Yvette (FR); Nicolas Boulant, Gif sur Yvette (FR); Michel Luong, Gif sur Yvette (FR); Alexis Amadon, Gif sur Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/110,598

(22) Filed: Dec. 3, 2020

(65) Prior Publication Data
US 2021/0173031 A1 Jun. 10, 2021

(30) Foreign Application Priority Data

Dec. 6, 2019 (EP) .................................. 19306589

(51) Int. Cl.
*G01R 33/54* (2006.01)
*G01R 33/385* (2006.01)
(Continued)

(52) U.S. Cl.
CPC ......... *G01R 33/546* (2013.01); *G01R 33/385* (2013.01); *G01R 33/443* (2013.01); *G01R 33/5612* (2013.01)

(58) Field of Classification Search
CPC .. G01R 33/546; G01R 33/385; G01R 33/443; G01R 33/5612
See application file for complete search history.

(56) References Cited

U.S. PATENT DOCUMENTS

2020/0011953 A1* 1/2020 Tomi-Tricot ......... G06K 9/6277

FOREIGN PATENT DOCUMENTS

WO 2017/060142 A1 4/2017

OTHER PUBLICATIONS

Bernstein, et al., "Imaging artifacts at 3.0T", J Magn Reson Imaging, 24(4), pp. 735-746, 2006.
(Continued)

*Primary Examiner* — G. M. A Hyder
(74) *Attorney, Agent, or Firm* — BakerHostetler (57) ABSTRACT

A method of designing a pulse sequence for parallel-transmission MRI includes a) for each one of a plurality of subjects, estimating a linear adjustment transformation (L), converting amplitude maps of RF fields generated by respective transmit channels of a MRI apparatus into respective standardized maps; and b) determining RF waveforms (P) minimizing a discrepancy between subject-specific distributions of flip-angles of nuclear spin and a target distribution, averaged over said subjects, the subject-specific distributions corresponding to the flip-angle distributions achieved by applying a superposition of RF fields, each having a temporal profile described by one of said RF waveforms and a spatial amplitude distribution described by a respective standardized map determined for the subject. A method and an apparatus for performing parallel-transmission MRI using such a pulse sequence are provided.

12 Claims, 4 Drawing Sheets

(51) Int. Cl.
  *G01R 33/44*    (2006.01)
  *G01R 33/561*   (2006.01)

(56) References Cited

OTHER PUBLICATIONS

Franklin et al., "Improvement in B1-inhomogeneity artifacts in the abdomen at 3T MR imaging using a radiofrequency cushion", J Magn Reson Imaging, 27(6), p. 1443-1447, 2008.

Hajnal, et al., "Initial Experience with RF shimming at 3T using a whole body 8 channel RF system", Proceedings of the 16th Annual Meeting of ISMRM, p. 496, 2008.

Katscher, et al., "Transmit SENSE", Magn Reson Med, 49(1), pp. 144-150, 2003.

Tricot, et al., "B1 artifact reduction in abdominal DCE-MRI using kT-points: First clinical assessment of dynamic RF shimming at 3T", J Magn Reson Imaging, 47, pp. 1562-1571, 2018.

Cloos, et al., "kT-points: Short three-dimensional tailored RF pulses for flip-angle homogenization over an extended volume"., Magnetic Resonance in Medicine, vol. 67, pp. 72-80, (2012).

Gras, et al., "Universal pulses: A new concept for calibration-free parallel transmission", Magn Reson Med, 77(2), pp. 635-643, 2017.

Tricot, et al., "SmartPulse, a Machine Learning Approach for Calibration-Free Dynamic RF Shimming: Preliminary Study in a Clinical Environment", Magnetic Resonance in Medicine, Magn Reson Med., vol. 82, pp. 2016-2031, 2019.

Brunheim et al., "Fast and accurate multi-channel mapping based on the TIAMO technique for 7T UHF body MRI", Magnetic Resonance in Medicine, vol. 79, No. 5, pp. 2652-2664, 2018.

Alotto, et al., "Robust target functions in electromagnetic design", COMPEL, vol. 22, No. 3, pp. 549-560, Sep. 2003.

Steiner, et al., "Statistical robust design using the unscented transformation," COMPEL—The international journal for computation and mathematics in electrical and electronic engineering, vol. 24, No. 2, pp. 606-619, Jun. 2005.

Fautz, et al., "B1 mapping of coil arrays for parallel transmission", Proceedings of the 16th Annual Meeting of ISMRM, p. 1247, 2008.

Brunner, et al., "B1 + interferometry for the calibration of RF transmitter arrays", Magn Reson Med, vol. 61, No. 6, pp. 1480-1488, 2009.

Amadon, et al., "Validation of a very fast B1-mapping sequence for parallel transmission on a human brain at 7T", Proceedings of the 20th Annual Meeting of ISMRM, p. 3358, 2012.

\* cited by examiner

METHOD OF DESIGNING A PULSE SEQUENCE FOR PARALLEL-TRANSMISSION MRI, AND A METHOD OF PERFORMING PARALLEL-TRANSMISSION MRI USING SUCH A PULSE SEQUENCE

CROSS-REFERENCE TO RELATED APPLICATIONS

This application claims priority to foreign European patent application No. EP 19306589.3, filed on Dec. 6, 2019, the disclosure of which is incorporated by reference in its entirety.

FIELD OF THE INVENTION

The invention relates to a method of designing a pulse sequence for parallel-transmission magnetic resonance imaging and of performing parallel-transmission magnetic resonance imaging using such a sequence. A pulse sequence comprises one or more radio-frequency (RF) waveforms, or pulses, and at least one magnetic field gradient waveform, allowing manipulating the nuclear magnetization of a sample immersed in a static magnetic field, resulting from the orientation of nuclear spins.

BACKGROUND

High field magnetic resonance imaging (MRI) has proved its utility in clinical routine thanks to the high signal-to-noise ratio (SNR) it provides, allowing finer temporal and/or spatial resolutions. However, a number of problems inherent to high field still hamper the spread of high-field (3 T-7 T) scanners in hospitals worldwide. Among them is the "$B_1$ artifact" that occurs when the RF wavelength gets close to, or smaller than, the imaged region ([1]). In such a case, the transmitted radio-frequency "$B_1^*$" field becomes inhomogeneous within the region of interest, resulting in an inhomogeneous distribution of nuclear magnetization flip angles. This leads to the appearance of zones of shade and loss of contrast, which can affect diagnosis by hiding pathologies or by altering the observed enhancement ratio in contrast-agent-injected sequences. At 3 T, this artifact is particularly pregnant in abdominal imaging, and it becomes very problematic for brain imaging at ultra-high fields (UHF—7 T and above).

Passive RF shimming involves the use of dielectric pads for compensating $B_1$ inhomogeneity ([2]). Its effectiveness is somehow limited.

Active RF shimming makes use of parallel transmission (pTx), i.e. of multiple RF coils for exciting nuclear spins. Two main sorts of active RF shimming techniques exist: static and dynamic.

In static active RF shimming, the plurality of radio-frequency RF coil elements all transmit the same RF pulse with different complex weights, optimized to homogenize the $B_1$ field [3]. For abdomen imaging at 3 T, this technique is satisfactory for most patients, but it fails to offer homogeneous-enough excitation in about 10 to 20% of the cases, which is not acceptable. For higher field values, static active RF shimming is usually not satisfactory.

Dynamic RF shimming [4] consists in using multiple RF coils to simultaneously transmit respective RF pulses having different temporal waveforms, usually defined by complex time-varying envelopes. This technique allows achieving better uniformity than static shimming, but its complexity has made it essentially a research tool.

Reference [5] demonstrates the superiority of $k_T$-points [6] dynamic RF shimming in clinical routine for nonselective excitation of the abdomen at 3 T.

Optimizing weighting coefficients (static shimming) or RF waveforms (dynamic shimming) requires calibration consisting at least in the measurement of $B_1^+$ maps from each transmit channel moreover, for optimal dynamic RF shimming, an off-resonance frequency $\Delta f_0$ map (corresponding to a static field inhomogeneity $\Delta B_0$ map if no chemical shift like fat tissue is present) is also required before computation of the RF pulse. These computations are time consuming. For instance, on a 3 T scanner with two channels, the whole calibration process can last nearly two minutes: 30 seconds for $B_1^+$ mapping, 15 seconds for $\Delta f_0$ mapping, and between 5 seconds (static RF shimming) and 60 seconds (kT-points) for pulse design itself. This is even worse when the number of channels increases.

"Universal pulses", introduced in [7], allows calibration-free dynamic RF-shimming: instead of designing a pulse specific to each subject, a pulse robust to inter-subject variability is created once and for all using calibration data of a population of subjects. Universal pulses were successfully implemented in the brain at 7 T, with a variety of sequences and weightings, and different underlying pulse designs.

Universality, however, compromises individual homogeneity. Even if they provide acceptable results for a majority of the subjects, universal pulses fail to provide homogeneous-enough excitation in a significant number of cases.

A compromise solution, suggested in [8], consists in computing different "semi-universal" pulses, tailored to different groups of imaging subjects. More precisely, according to [8], a set of subjects are grouped into a plurality of cohorts according to morphological features—e.g. the size of the head for brain imaging—and a "semi-universal" pulse sequence is designed for each cohort. The same morphological features are then used for choosing the best suited pulse sequence for additional subjects. A drawback of this approach is that the cohorts are formed on an empirical basis, with no guarantee of the relevance of the features used for sorting the imaging subjects.

In order to overcome this drawback, [9] discloses a method—called "Smart Pulse"—wherein a population of subjects is divided into clusters, and one pseudo-universal pulse sequence is designed for each cluster. Then a machine learning algorithm classifies new subjects to assign the best possible pulse to each one of them on the basis of at least a morphological feature. Contrarily to the "semi-universal" approach of [8], the clusters are not defined empirically on the basis of somehow arbitrary morphological features, but in a systematic way using a clustering algorithm.

SUMMARY OF THE INVENTION

The invention aims at providing a pulse design method providing better performances than the "Smart Pulse" approach in terms of fidelity to a target excitation pattern without requiring session-specific pulse engineering as e.g. in [4]-[6], but only a much simpler calibration process.

The invention is based on a different approach to describe the session (i.e. MRI subject) dependence of the actual $B_1^+$ profile, namely seeing it as the result of a virtual fluctuation of the scattering matrix of the TX (transmit) channels. Denoting by $B_{1,ref}^+$ the $B_1^+$ profile measured in one "reference" subject, this approach supposes the existence of a linear transformation, called adjustment transformation, which may be expressed by a complex so-called adjustment matrix L of dimensions $N_c \times N_c$ ($N_c$ being the number of transmit channels), such that $B_1^+(r)=LB_{1,ref}^+(r)$ for all locations r in the imaged object. It is important to note that, this model is essentially global since L is supposed to be independent of the position r. In reality, the TX field distribution, which depends in a complex manner on the electromagnetic properties of the sample and on the electromagnetic coupling between the TX channels and the body, does not exactly obey this simple rule. Experimentally, it remains nonetheless possible to estimate the best candidate matrix according to a suitable criterion, e.g. by Moore-Penrose pseudoinverse computation.

It is key to mention here that the computation of the adjustment transformation (matrix) essentially uses the subject-specific $B_1^+$ map and so, apparently, does not eliminate the $B_1^+$ calibration step. However, the pseudo-inverse computation projects from a space of dimension $N_c \times M$ (M denoting the number of spatial positions) to a space of much smaller dimension $N_c \times N_c$ ($N_c \ll M$ in practice). It follows that this operation tends to be unaffected if only a subsample of the positions is acquired. Therefore, the adjustment matrix can be estimated from a much smaller set of measurement than the one required for full $B_1^+$ mapping.

Knowing the session specific adjustment matrix which, as mentioned above, is easily accessible with a rapid calibration technique, one may subsequently compute the so-called standardized resonant TX field distribution, defined as $\tilde{B}_1^+(r)=L^{-1}B_1^+(r)$.

The inventors have experimentally verified that the covariance matrix of the standardized TX field distributions measured across several different individuals is substantially reduced as compared to the covariance matrix of the actual physical TX field. In other words, the adjustment transformation allows mapping the TX field distribution in a virtual space wherein the inter-subject variability in the resonant TX field in reduced.

An idea at the basis of the invention is then to design a "universal" pulse sequence using standardized fields for a plurality of subjects instead of the actual physical TX fields. When pTX MRI has to be performed on a subject, a simple calibration method is used for estimating the subject's adjustment transformations; the pulse sequence suitable for this subject is then computed by applying the subject's inverse adjustment transformation to the "universal" sequence. Otherwise stated, the (inverse) adjustment transformation allows "customizing" the universal sequence derived from standardized fields.

An object of the present invention is then a computer-implemented method of designing a pulse sequence for parallel-transmission magnetic resonance imaging, said pulse sequence comprising at least a magnetic field gradient waveform and a set of radio-frequency waveforms, each radio-frequency waveform of said set being associated to a respective transmit channel of a parallel-transmission magnetic resonance imaging apparatus, the method comprising:

a) for each one of a plurality of magnetic resonance imaging subjects, estimating a linear transformation, called adjustment transformation, converting amplitude maps of radio-frequency fields generated within a region of interest comprising a body part of the subject by respective transmit channels of the magnetic resonance imaging apparatus into respective standardized maps, the adjustment transformation being chosen in such a way as to minimize a first cost function representative of an averaged difference between the standardized maps for the subject and respective reference amplitude maps for a reference subject; and b) determining at least said radio-frequency waveforms in such a way as to minimize a second cost function representative of a discrepancy between subject-specific distributions of flip-angles of nuclear spin and a target distribution, averaged over said plurality of magnetic resonance imaging subjects, the subject-specific distributions corresponding to the flip-angle distributions achieved by applying a magnetic field gradient waveform and a superposition of radio-frequency fields, each of said radio-frequency fields having a temporal profile described by one of said radio-frequency waveforms and a spatial amplitude distribution described by a respective standardized map determined for the subject.

Another object of the invention is a method of performing parallel-transmission magnetic resonance imaging of a subject using a parallel-transmission magnetic resonance imaging apparatus comprising a set of gradient coils, a plurality of transmit channels and a plurality of receive channels, the method comprising the steps of:

i) using the receive channels of the apparatus for performing measurements representative of spatial distributions of radio-frequency fields generated by respective transmit channels within a region of interest comprising a body part of the subject;

ii) using results of said measurements, estimating a linear transformation, called adjustment transformation, converting amplitude maps of radio-frequency fields generated within the region of interest by respective transmit channels of the magnetic resonance imaging apparatus into respective standardized maps, the adjustment transformation being chosen in such a way as to minimize a cost function representative of an averaged difference between the standardized maps for the subject and respective reference amplitude maps for a reference subject;

iii) inverting the adjustment transformation, and computing a set of subject-specific radio-frequency waveforms by applying the inverted adjustment transformation to a set of predetermined reference radio-frequency waveforms; and iv) applying each subject-specific radio-frequency waveform to a respective transmit channel while applying a magnetic field gradient waveform to the gradient coils, and using the receive channels to receive parallel-transmission magnetic resonance imaging signals.

Yet another object of the invention is a parallel-transmission magnetic resonance imaging apparatus comprising a set of gradient coils, a plurality of transmit channels, a plurality of receive channels and a data processor, characterized in that:

it further comprises a memory device storing data defining a set of predetermined reference radio-frequency waveforms and a magnetic field gradient waveform; and in that the data processor is programmed or configured for:

driving the receive channels to perform measurements representative of spatial distributions of radio-frequency fields generated by the respective transmit channels within a region of interest comprising a body part of the subject;

using results of said measurements, estimating a linear transformation, called adjustment transformation, converting amplitude maps of radio-frequency fields generated within the region of interest by respective transmit channels into respective standardized maps, the adjustment transformation being chosen in such a way as to minimize a cost function representative of an averaged difference between the standardized maps for the subject and respective reference amplitude maps for a reference subject;

inverting the adjustment transformation and computing a set of subject-specific radio-frequency waveforms by applying the inverted adjustment transformation to a set of predetermined reference radio-frequency waveforms; and driving the transmit channels to play respective subject-specific radio-frequency waveforms, the gradient coils to play a magnetic field gradient waveform and the receive coil to receive parallel-transmission magnetic resonance imaging signals.

BRIEF DESCRIPTION OF THE DRAWINGS

Additional features and advantages of the present invention will become apparent from the subsequent description, taken in conjunction with the accompanying drawings, which show.

DETAILED DESCRIPTION

A parallel-transmission magnetic resonance imaging apparatus comprising an array of $N_c>1$ RF coils (or resonators) implementing independently-driven transmit channels. The array is often cylindrical and encloses a region wherein a body part (e.g. the head) of a MRI subject can be introduced.

Figure 1A:
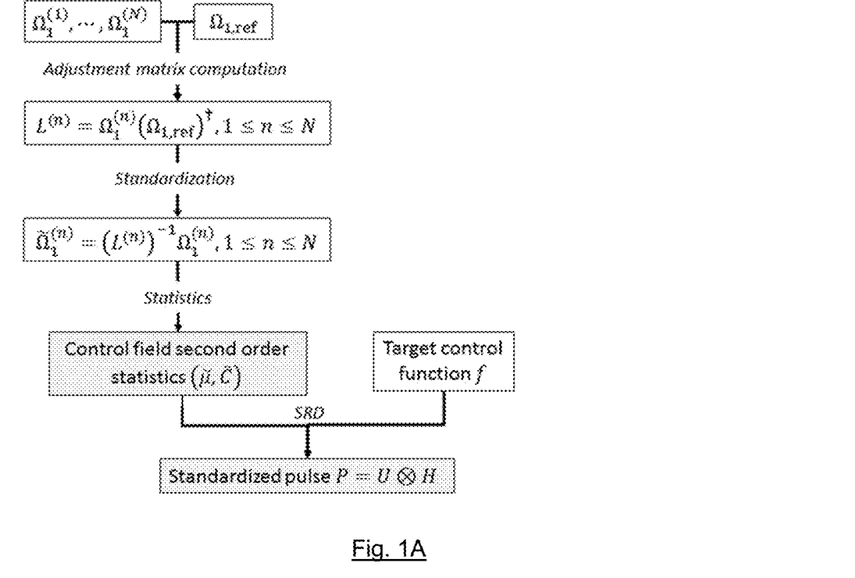
FIGS. 1A and 1B, respectively, flow-chart of a method for designing a "standardized" pulse sequence according to an embodiment of the invention and of a method for applying such a pulse sequence in a MRI session.

FIG. 1A shows the different steps of a method for designing a pulse sequence according to an embodiment of the invention.

Let $B_{1,c}^+(r)$ (Tesla) denote the spatially dependent transmit RF magnetic field of the $c^{th}$ resonator of the transmit array and $\gamma=42.57 \times 10^6$ Hz/T the gyromagnetic ratio of the proton. The so-called control field components $\omega_{1,c}= 2\pi\gamma B_{1,c}^+$ (rad/s/V), $1 \le c \le N_c$, may then be arranged in a vector $\omega_1(r)=(\omega_{1,1}, \ldots, \omega_{1,N_c})^t \in \mathbb{C}^{N_c \times 1}$ called the control field vector.

It is important to recall that the RF field spatial distribution is not only a function of the geometry of the array, but it is also affected by the presence of the body part and therefore depends on the MRI subject. The control field vector for a given realization—and therefore subject—can be measured using several known techniques, see e.g. [10].

For a given realization of the control field $\omega_1$, corresponding to a particular MRI subject—$\mathcal{R}$ designates the set of positions r where $\omega_1(r)$ is known. As the control field distribution is typically obtained by MR (magnetic resonance) acquisitions, it is common in practice that $\mathcal{R}$ is limited in space (no MR signal in air, and existence of regions where the reconstruction of $B_1^+$ is not reliable).

The control field distribution $(\omega_1(r))_{r \in \mathcal{R}}$ can be conveniently represented as a $N_c \times M$ complex matrix denoted by $\Omega_1(\mathcal{R})$, where $M \triangleq |\mathcal{R}|$ is the number of positions contained in $\mathcal{R}$. More precisely, $\Omega_1^{(n)}(\mathcal{R})$, with $n=1 \ldots N$, represents the control field for the $n^{th}$ MRI subject. $\Omega_{1,ref}$ designates a "reference control field", defined as the control field distribution of one particular realization (i.e. for a particular MRI subject) taken as a reference.

Measured control fields for N>1 (typically at least ten, and typically several tens) subjects, plus the reference subject, constitute the input data of a pulse design method according to one embodiment of the invention, as illustrated on FIG. 1A.

In some embodiments of the invention, some or all of the control fields may be computed by performing full electromagnetic simulations taking into account the anatomy of real or virtual subjects.

Let $\mathcal{R}_{ref}$ denote the region over which the reference control field is defined. Let us denote by $L^{(n)}$ the $N_c \times N_c$ complex matrix (adjustment transformation, or matrix) satisfying:

$$\min_{L^{(n)}} \|\Omega_1^{(n)}(\mathcal{R} \cap \mathcal{R}_{ref}) - L^{(n)} \Omega_{1,ref}(\mathcal{R} \cap \mathcal{R}_{ref})\|_2 \quad (1)$$

where $\| \|_2$ is the $L_2$ norm. The meaning of equation (1) is that $L^{(n)}$ approximately transforms the control field distribution for the $n^{th}$ subject into the reference control field in the space region wherein both fields are defined, the approximation being the best in the sense of least-square error minimization. Other cost functions may be used as a criterion for defining the "optimal" transformation, but the mean-square error is particularly expedient from a mathematical point of view. Indeed, the solution of equation (1) is simply obtained by right-multiplying $\Omega_1$ with the Moore-Penrose pseudo-inverse of $\Omega_{1,ref}(\mathcal{R} \cap \mathcal{R}_{ref})$, denoted by $(\Omega_{1,ref}(\mathcal{R} \cap \mathcal{R}_{ref}))^\dagger$:

$$L^{(n)} = \Omega_1^{(n)}(\mathcal{R} \cap \mathcal{R}_{ref})(\Omega_{1,ref}(\mathcal{R} \cap \mathcal{R}_{ref}))^\dagger \quad (2)$$

The adjustment transformations allow defining the $\Omega_{1,ref}$-standardized control field (or simply "standardized fields") as:

$$\tilde{\omega}_1^{(n)}(r) = (L^{(n)})^{-1} \omega_1^{(n)}(r). \quad (3)$$

It will be assumed that both the control fields and the standardized control fields are random variables following Gaussian laws defined by their second-order statistics: $\omega_1(r) \sim N(\mu(r), C(r))$ and $\tilde{\omega}_1(r) \sim N(\tilde{\mu}(r), \tilde{C}(r))$—the $^{(n)}$ apex are omitted when this is possible without inducing ambiguity. If the number N of subjects (excluding the reference subject) is much larger than $N_c$ (by at least a factor of ten), the second-order statistics of the control fields can be computed as follows (where "*" represents Hermitian conjugation):

$$\hat{\mu}(r) = \frac{1}{N} \sum_{n=1}^{N} \omega_1^{(n)}(r) \quad (4)$$

-continued $$\hat{C}(r) = \frac{1}{N}\sum_{n=1}^{N}(\omega_1^{(n)}(r) - \hat{\mu}(r))(\omega_1^{(n)}(r) - \hat{\mu}(r))^* \quad (5)$$

Analogous formulas allow computing the second order statistics of the standardized control fields ("standardized control statistics").

If N is not large enough, the Ledoit-Wolf estimation may be used for the covariance matrix.

The set of standardized control fields—or simply the corresponding standardized control statistics—are then used to perform statistically robust design (SRD) of pulse sequences (the simpler term "pulse" will also be used) in accordance to a target control function f also provided as an input to the design method.

Before describing a specific SRD approach, it is useful to recall some fundamental theoretical results.

A spin excitation pulse sequence (or simply "pulse") is comprised of a set of time-discretized radiofrequency (RF) waveforms $U(t) \in \mathbb{C}^{1 \times N_c}$ (Volt) and of a set of magnetic field gradient (MFG) waveforms $G(t) \in \mathbb{R}^{1 \times 3}$ (T/m). The duration of these waveforms is denoted by T. In the following, we will also make use of the MFG waveform multiplied by the gyromagnetic ratio of the proton:

$$H(t) = 2\pi\gamma G(t) \quad (6)$$

For simplicity, the pulse P, which is given by the definition of the RF and MFG waveforms U and H is denoted by:

$$P = U \odot H. \quad (7)$$

Neglecting relaxation and off-resonances during the excitation (this supposes that $T \ll T_{1,2}$ and off-resonance $$\ll \frac{1}{T}\Big),$$

the equation governing the evolution of the magnetization $M \in \mathbb{R}^3$ (equilibrium magnetization $(0\ 0\ M_0)^t$) during the application of the pulse is given by Bloch's equation:

$$\frac{dM}{dt}(r,t) = M(r,t)A_{P,\omega_1}(r,t) \quad (8)$$

where ($\Re(z)$ and $\Im(z)$ denote the real and imaginary part of z, respectively):

$$A_{P,\omega_1}(r,t) = \begin{pmatrix} 0 & H(t) \cdot r & -\Im(U(t)\omega_1(r)) \\ -H(t) \cdot r & 0 & \Re(U(t)\omega_1(r)) \\ \Im(U(t)\omega_1(r)) & -\Re(U(t)\omega_1(r)) & 0 \end{pmatrix}$$

The mapping $(r,t) \mapsto A_{P,\omega_1}(r,t)$—which depends on $\omega_1$ and $P = U \odot H$—completely characterizes the equation that governs the dynamics of the spin system.

Given a pulse P and a control field distribution, $\omega_1$, one may solve (at least numerically) Bloch's equation and express the magnetization at time T as:

$$M(r,T) = e^{\overline{A}_{P,\omega_1}(r)T} M(0) \quad (10)$$

Where $\overline{A}(r)$ is of the form:

$$\overline{A}_{P,\omega_1}(r) = \begin{pmatrix} 0 & \overline{A}_{P,\omega_1}^z(r) & -\overline{A}_{P,\omega_1}^y(r) \\ -\overline{A}_{P,\omega_1}^z(r) & 0 & \overline{A}_{P,\omega_1}^x(r) \\ \overline{A}_{P,\omega_1}^y(r) & -\overline{A}_{P,\omega_1}^x(r) & 0 \end{pmatrix} \quad (11)$$

The pulse design engineering problem, conversely, consists in setting a condition on the desired control target of the form:

$$f\left(r, e^{\overline{A}_{P,\omega_1}(r)T}\right) = 0 \quad (12)$$

In MRI, as the condition, generally, cannot be met perfectly for all positions simultaneously, this problem is usually solved by minimizing a metric of the form:

$$\sum_{r \in \mathcal{R}_{design}} \left| f\left(r, e^{\overline{A}_{P,\omega_1}(r)T}\right) \right|^2 \quad (13)$$

where $\mathcal{R}_{design}$ denote a region of interest (e.g. corresponding to the brain), any point outside this region being ignored in this performance metric.

When the control field $\omega_1(r)$ is stochastic, then $\overline{A}_{P,\omega_1}(r)$ is also stochastic and the pulse optimization can be recast into a so-called "statistic robust design" (SRD) problem. In this approach, a new design parameter $0 \leq \theta \leq 1$, called tolerance and the error level $\Delta$ are defined as:

$$\Delta(P,\theta) = \min\{\Delta \geq 0; \Pi_P(\Delta, r) \leq \theta \forall r \in \mathcal{R}_{design}\} \quad (14)$$

where $\Pi_P(\Delta, r)$ denotes the probability that $|f(r, e^{\overline{A}_{P}(r)T})|$ exceeds $\Delta$.

The optimization problem (14) becomes then:

$$\min_P(\Delta(P, \theta)) \quad (15)$$

In practice the computation of $\Delta(P, \theta)$ is difficult, therefore problem (14) is simplified into a more tractable optimization problem whose optimum is assumed to be close to the optimum of the above problem, see e.g. (14), (15).

One such pulse engineering problem is given by the equation:

$$\min_P \sum_{r \in \mathcal{R}_{design}} \left\langle f\left(r, e^{\overline{A}_{P,\omega_1}(r)T}\right) \right\rangle^2 \quad (16)$$

As we have assumed that the statistical distribution of the control field $\omega_1(r)$ is Gaussian with mean value $\mu(r)$ and covariance $C(r)$, for all positions r, the term $\langle FA_P(r) - FA_t \rangle^2$ in Eq. 17 is a function of $\mu(r)$ and $C(r)$. Thus, an interesting feature of equation (17) is that the optimization does not need full knowledge of the control fields, but only its second-order statistics, as illustrated on FIG. 1A. A solution of such "relaxed" form of the pulse engineering problem $f(r, e^{\overline{A}(r)T}) = 0$ taking into account the statistical distribution of the control field $\omega_1$ is said to be designed on $\omega_1$'s statistics.

Typically, the desired control target function f represents a target distribution of flip angles of nuclear spins, $FA_t$. Most often, but not always, this target distribution corresponds to a constant flip angle over a region of interest (e.g. a subject's brain).

The flip angle distribution $FA_{P,\omega_1}(r)$. is computed from equation (10) as follows $$FA_{P,\omega_1}(r) = acos\left(\begin{pmatrix} 0 & 0 & 1 \end{pmatrix} e^{A_{P,\omega_1}(r)} \begin{pmatrix} 0 & 0 & 1 \end{pmatrix}^t\right) \quad (17)$$

In other words, the local performance metric $$f\left(r, e^{A_{P,\omega_1}(r)T}\right)$$

(see Equation 12) here takes the form:

$$f(r, e^{\bar{A}_P(r)T}) = FA_P(r) - FA_t \quad (18)$$

For simplicity, here, neither constraints on the energy of the pulse nor on the MFG slew rate are taken into account here. However these constraints can be added explicitly to the pulse engineering problem by replacing the pulse engineering problem of Eq. (16) with the constrained optimization problem:

$$\min_P \sum_{r \in \mathcal{R}_{design}} \left\{f\left(r, e^{\bar{A}_{P,\omega_1}(r)T}\right)\right\}^2 \quad (19)$$

subject to $\Gamma(P) \leq 0$

Where $\Gamma(P) \in \mathbb{R}^{N_{constr}}$ is the vector containing all constraints ($N_{constr}$) that needs to be observed to return a physically feasible pulse.

It should be understood that equation (16) is only one example of a "relaxed" optimization problem. Different forms of the problem, or even the true SRD optimization problem (16), can be applied to different embodiments of the invention, and in some cases deeper knowledge of the control fields will be required.

Moreover, according to different embodiments of the invention, both the RF waveform U and the gradient waveform H can be optimized, or only the RF waveform, the gradient waveform being predefined.

An essential feature of the invention, distinguishing it from the prior art, comes from the observation that statistically robust pulse design can be carried out using the standardized control fields $\tilde{\omega}_1^{(n)}(r)$ (or their second-order statistics) rather than the "physical" fields $\omega_1^{(n)}(r)$. In the example of the relaxed form of the SRD optimization problem (16), this is equivalent to replacing $$\left\{f\left(r, e^{A_{P,\omega_1}(r)T}\right)\right\}^2$$

with $$\left\{f\left(r, e^{A_{P,\tilde{\omega}_1}(r)T}\right)\right\}^2.$$

The result of such design is called a "standardized" pulse $P=U\odot H$.

Directly exposing a MRI subject to a standardized pulse would not provide the expected result, i.e. a spin flip angle distribution approximately matching the target. However let us consider, for a subject whose adjustment matrix is "L", a modified spin excitation pulse $P'=U'\odot H$ such that:

$$P'=(UL^{-1})\odot H \triangleq P/L \quad (20).$$

Otherwise stated, the RF component of P' is modified by being right-multiplied by the inverse adjustment matrix for the subject.

It can be observed that:

$$U'\omega_1=(UL^{-1})(L\tilde{\omega}_1)=U\tilde{\omega}_1 \quad (21)$$

And therefore:

$$A_{P',\omega_1} = A_{P,\tilde{\omega}_1}; \bar{A}_{P',\omega_1} = \bar{A}_{P,\tilde{\omega}_1} \quad (22)$$

i.e., that the action of P' on $\omega_1$ equals the action of P on the standardized field $\tilde{\omega}_1$. The modified pulse, computed from the standardized pulse and the subject-specific (inverse) adjustment matrix, does then provide the expected result, i.e. a spin flip angle distribution approximately matching the target.

Figure 1B:
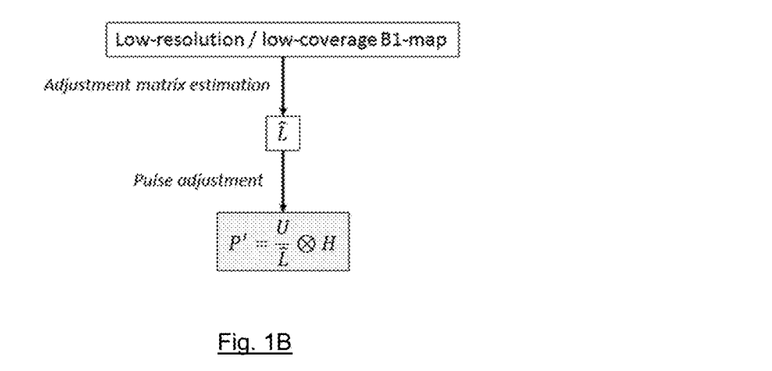

In order to perform spin-excitation on a subject it is then necessary to compute an estimator $\hat{L}$ of its adjustment matrix, and then to apply the inverse of the estimated adjustment matrix to the standardized pulse (rather, to its RF component), to obtain a modified pulse, specific to the subject and fit for the purpose defined during the standardized pulse design phase. This is illustrated on FIG. 1B, where $$\frac{U}{L}$$

is equivalent to $UL^{-1}$.

As discussed above, given that the least-squares problem given by Eq. 1 is largely overdetermined, the estimator L can be satisfactorily estimated from a subsampled control field $\Omega_1(F(\mathcal{R}))$, i.e:

$$\hat{L}=\Omega_1(F(\mathcal{R})\cap\mathcal{R}_{ref})\Omega_{1,ref}(F(\mathcal{R})\cap\mathcal{R}_{ref})^\dagger \quad (23)$$

where F is a subsampling operator which removes positions of $\mathcal{R}$. Therefore, the computation of $\hat{L}$ is much more efficient than the computation of a subject-specific optimal pulse.

The advantages provided by the invention will now be discussed with the help of a specific numerical example, illustrated by FIGS. 2A to 6.

MRI data were obtained on a parallel transmit enabled whole body Siemens 7 T system (Siemens Healthineers, Erlangen, Germany) equipped with an SC72 whole body gradient insert (200 mT/m/ms and 70 mT/m maximum gradient slew rate and maximum gradient amplitude). The parallel transmission system consisted of eight transmitters (1 kW peak power per channel). Measurements were made with the 8 Tx-32Rx Nova head coil (Nova Medical, Wilmington, Mass., USA). The data consist of a collection of N=36 $B_1^+$ maps measured on different adult subjects (age=40±20 years).

The protocol used to reconstruct the $B_1^+$ maps was a multi-slice interferometric turbo-FLASH acquisition ([13]-[15]) 5 mm isotropic resolution, matrix size 40×64×40, TR=20 s, TA=4 min 40 s).

Figure 2A:
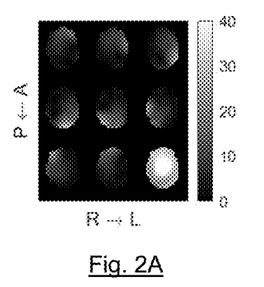
FIGS. 2A and 2B, the second-order statistics of the radio-frequency fields generated by the transmission channels of a parallel-transmission MRI apparatus.
Figure 2B:
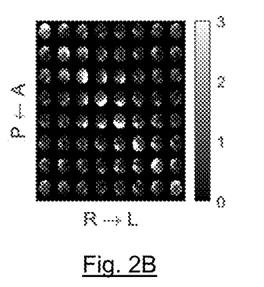

In FIGS. 2A and 2B, the second order statistics (mean: FIG. 2A; covariance: FIG. 2B) of the control field for the Nova TX array are displayed for one axial slice through the brain. The mean control field thus gives rise to eight axial images, each one corresponding to one TX channel.

P←A and R→L identify the antero-posterior and the right-left directions of the subjects.

Figure 3A:
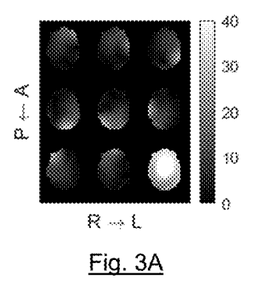
FIGS. 3A and 3B, the second-order statistics of standardized fields corresponding to the radio-frequency fields of FIGS. 2A and 2B.
Figure 3B:
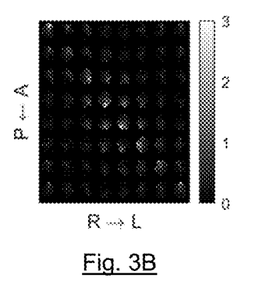

FIGS. 3A and 3B display, for the same axial slice, the reduced statistics $\tilde{\mu}$ and $\tilde{C}$ for the standardized fields statistics (mean: FIG. 3A; covariance: FIG. 3B). A visual comparison of FIGS. 2A/2B and FIGS. 3A/3B clearly indicates that the standardization procedure efficiently reduces the covariance of the control field vector.

As explained above, the adjustment matrices for the subjects may be computed using a reduced set of data. A particularly suitable choice for the subsampling operator F of equation (23) is the operator that selects a subset of the ensemble of acquired slices ($N_s$ denoting the number of acquired slices). For $1 \leq m \leq N_s$, $F_n$ denotes the operation consisting in retaining m evenly distributed slices across the optimization region (in this example, the volume of the brain) and $L_m = L_{F_m}$.

Figure 4A:
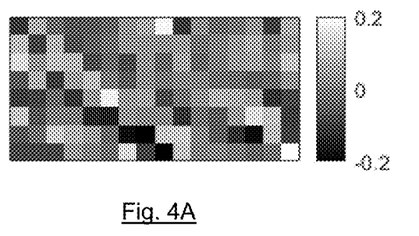
FIGS. 4A, 4B, and 4C, graphical representations of adjustment matrices for one particular subject.
Figure 4B:
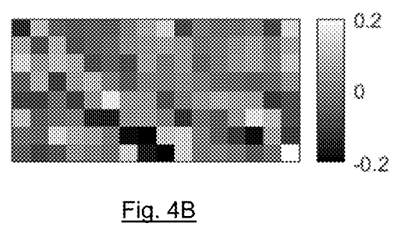

On FIGS. 4A and 4B, the 36 adjustment matrices (one per subject, the projection matrix for the first subject being the identity matrix) are shown for m=40 ($L_{40}$, FIG. 4A) and m=3 ($L_3$, FIG. 4B). Real and imaginary parts of the matrices are concatenated horizontally, and the 8×8 identity matrix $I_8$ is subtracted from every matrix to ease the visualization. Visually, there is hardly any difference between $L_3$ (only three slices used) and $L_{40}$ (all slices used). We found that $d(L_3, L_{40}) = \|L_3 L_{40}^{-1} - I_8\|_2$ (2-norm) was below 20% for all cases (subjects 2 to 36). This demonstrates that a substantially reduced dataset (3 slices out of 40) allows a satisfactory estimation of the adjustment matrices.

Figure 4C:
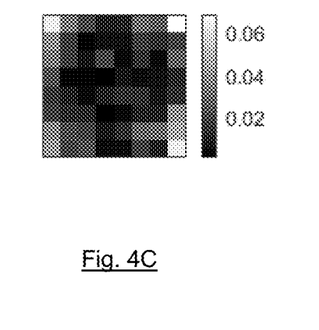
Figure 5:
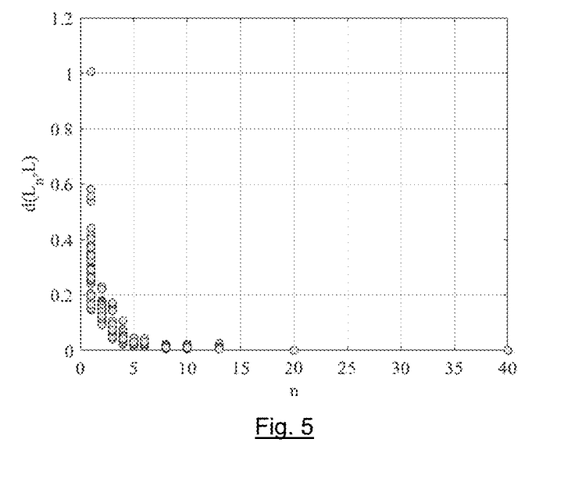
FIG. 5, a plot illustrating the impact of a reduction of the number of measurements used for estimating the adjustment matrices.

The difference in magnitude between the two adjustment matrices, $|L_3 - L_{40}|$ is shown in FIG. 4C;

FIG. 5 is a plot of the $d(L_m, L_{40})$ values for $1 \leq m \leq 40$. It can be seen that for $m \geq 3$, $d(L_m, L_{40}) < 0.2$. For $m < 3$ however, the estimation starts to diverge. This confirms that that a three-slice TX field mapping protocol would be sufficient to estimate correctly the projection matrix. Taking only the central slice for instance, however, would be insufficient ($d(L_m, L_{40}) > 0.5$ for some subjects).

Universal $k_T$-point pulses ([6]) for the Nova TX array where designed by following the SRD approach described above, optimized to create uniform 10° flip angle excitation across the brain. For that purpose, the design region, $\mathcal{R}_{design}$, was defined as:

$$r \in \mathcal{R}_{design} \Leftrightarrow \frac{1}{N}\left(\sum_{n=1}^{N} 1_{\mathcal{R}_b^{(n)}}(r)\right) > 0.5 \quad (24)$$

where $\mathcal{R}_b^{(n)}$ denotes the brain region for subject #n and $1_{\mathcal{R}_b^{(n)}}(\cdot)$ is the characteristic function of $\mathcal{R}_b^{(n)}$.

For the design, the spins were assumed to be on-resonant ($\omega_0=0$) everywhere across the head. The optimization was made on the flip angle (measuring by how much a magnetization initially along z is tipped from the z axis) distribution $FA_{P,\tilde{\omega}_1}(r)$.

For simplicity, here, no constraint on the energy of the pulse nor on the MFG slew rate was taken into account. However, once the solution of the problem is determined, by possibly increasing the sub-pulse and MFG blip duration, the solution can be adapted to satisfy all hardware (peak RF power, average RF power or MFG slew rate limitations) or safety (specific absorption rate) constraints. In this numerical application, the number of kT-points was set to 5, and their position in the k-space determined by the SRD approach described above.

Statistical robust solutions were computed numerically with the natural ($\mu$, C) and the reduced ($\tilde{\mu}$, $\tilde{C}$) control field statistics as input statistics using Equation (16) ("relaxed" SRD). The solution computed using the second-order statistics ($\mu$, C) of the natural fields will be called in the following "Universal Pulse" UP, as it corresponds to the method disclosed in [7]. The solution computed using the second-order statistics ($\tilde{\mu}$, $\tilde{C}$) of the standardized fields will be called in the following "Standardized Universal Pulses" SUP.

For every subject, subject-tailored (ST) pulses were also computed, using the same parameterization as for the UP and SUP. The cost function to minimize was:

$$\min_P \sum_{r \in F_m(\mathcal{R}_b^{(n)})} \left(f\left(\exp\left(\overline{A}_{P,\omega_1^{(n)}}(r)T\right)\right)\right)^2 \quad (25)$$

Where we recall that $\omega_1^{(n)}$ denotes the subject-specific control field distribution for subject #n.

The subject-tailored solution obtained from m slices is denoted by $P_{ST^m} = U_{ST^m} \odot H_{ST^m}$. When the complete set of slices is used, it is simply referred to as $P_{ST}$.

The performance analysis of the UP, SUP consisted in simulating for every subject (36 simulations) the flip angle distribution and computing the Normalized Root Mean Square (NRMS) deviation of the latter from the target, referred below to as the flip angle NRMS control error (FA-NRMSE). Here, for every realization of the control field (i.e., every subject), 5 pulses were tested the four pulses: i) $P_{UP}$, ii) $P_{SUP}/L_{40}$, iii) $P_{SUP}/L_3$, iv) $P_{ST}$, and v) $P_{ST^3}$ where $L_{40}$ and $L_3$ are the subject-specific projection matrix calculated on all (40) slices and 3 slices respectively.

Figure 6:
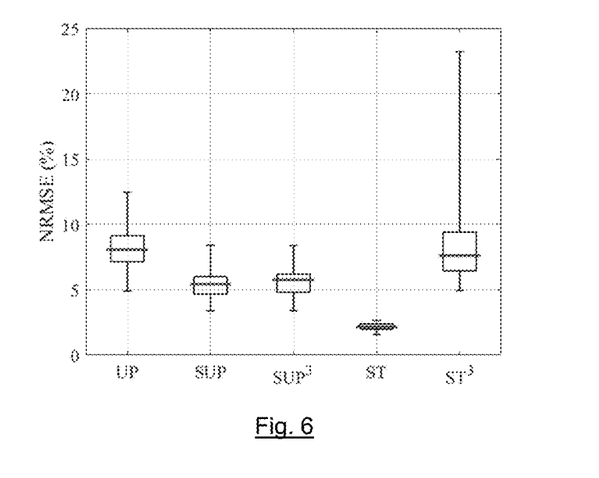
FIG. 6, a plot illustrating the performances of different embodiments of the inventive methods, compared to those of the prior art, and FIG. 7, a schematic representation of a parallel-transmission magnetic resonance apparatus suitable for carrying out the invention.

The result of the FA-NRMSE analysis is presented in FIG. 6 where, for each kind of pulse, the error bar identifies the lowest and highest NRMSE, the horizontal bar in the middle its median value and the box contains 75% of the subjects. The plot displays a FA-NRMSE on average equal to 8% with the 5-$k_T$-point UP against ~5% with the equivalent 5-$k_T$-point SUP, i.e. nearly the ultimate UP performance. An optimal adjustment of the SUP ($P_{SUP} \mapsto P_{SUP}/L_{40}$) or an adjustment of the SUP with only 3 slices ($P_{SUP} \mapsto P_{SUP}/L_3$) are seen to yield very comparable performances in terms of FA-NRMSE (on average across subject 5.5% and 5.7% respectively), confirming the analysis reported in FIG. 5. The subject tailored pulse returns a FA-NRMSE, on average equal to 2.3% when all slices were used for the pulse design (ST) and increased to 8.4% when only three slices where used ($ST^3$).

In conclusion, the inventive method (SUP pulses) provides better uniformity than the Universal Pulse (UP) approach, while requiring a rather simple calibration (e.g. only using three-slice MRI) for determining the subject-specific adjustment transformations. Subject-tailored (ST) pulses achieve even better uniformity, but they require a much heavier calibration (trying to reduce the complexity of the calibration step, as it was done in the $ST^3$ example, yields inacceptable results).

The calibration step may be further simplified by deriving the inverse adjustment transformation for the user from measurements other than MR acquisitions. For instance, the measured noise covariance matrix for a plurality of receive channels of the MRI scanner is influenced by the subject body part in the scanner. A machine-learning algorithm may then be used to estimate the inverse adjustment matrix from noise measurements. Several different kind of measurements (e.g. MR and noise) may also be combined.

Biometric and/or anagraphical data of the user (e.g. size of the head, sex, age . . . ) may also be taken into account, combined with measurements, for estimating the adjustment transformations.

Figure 7:
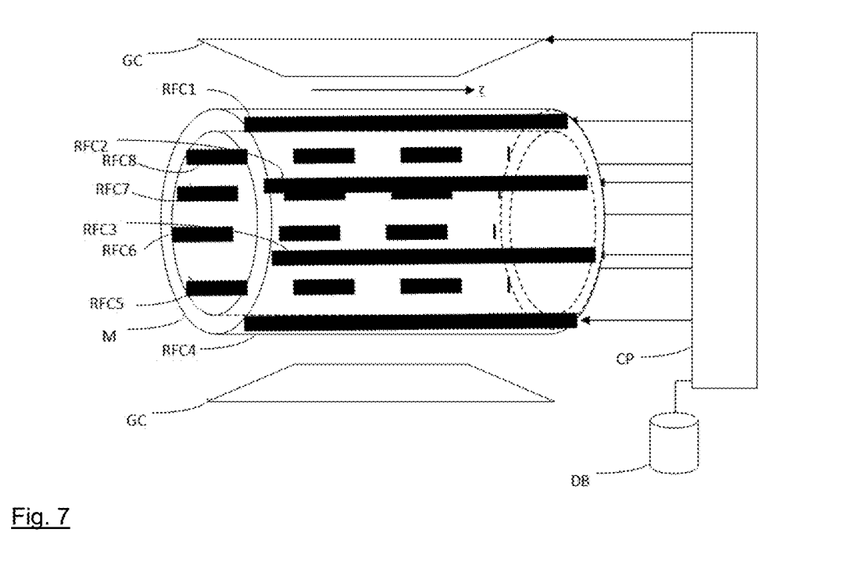

FIG. 7 is a very simplified representation of a parallel-transmission MRI apparatus (or scanner), suitable for carrying out the invention. Reference M designates a magnet for generating a strong (e.g. 3 T or even 7 T) static magnetic field $B_0$ oriented along a "longitudinal" direction z which, in the case of FIG. 7, is horizontal. The magnet is cylindrical and hollow, to allow the insertion of a subject (typically a human being) or of a body part thereof (e.g. the head). Additional magnets, called gradient coils (reference GC), are disposed outside the main magnet M and can be driven by slow (i.e. not at radio-frequency) waveforms generating slowly-varying magnetic fields exhibiting intensity gradients along three orthogonal spatial dimensions (gradient waveforms). On the figure, only a pair of gradient coils is represented, allowing the generation of a gradient along a single spatial dimension. A plurality of radio-frequency coil elements are arranged at the periphery of the internal volume of the main coil M; in the example of FIG. 7 there are 8 of them: RFC1, RFC2, RFC3, RFC4, RFC5, RFC6, RFC7, RFC8. The coil elements are part of respective transmission channels, also including non-represented devices such as amplifiers, which are independently driven by a computer to emit respective RF pulses which, in general, have a same carrier frequency (at the Larmor frequency) and different, time-varying amplitudes and phases, which may be defined by a complex envelope (RF waveforms). Receive channels are also provided for detecting a magnetic resonance signal (not represented).

The computer also drives the gradient coils GC to generate gradient waveforms. The (inhomogeneous) RF field B1+ is generated by the RF coil elements; the ensemble formed by the RF coil elements is sometimes called a (RF) coil or array.

According to the invention, the complex envelopes of a "standardized" pulse sequences, comprising one RF waveform for each transmission channel of the scanner and gradient waveforms is stored in a memory device to which computer CP has access. Moreover, computer CP is programmed to drive the scanner to perform measurements representative of spatial distributions of radio-frequency fields generated by the RF array; use the results of said measurements for estimating a subject-specific adjustment matrix, apply said adjustment matrix (or, rather, its inverse) to the standardized pulse to compute a subject-specific modified pulse and drive the RF and gradient coils to play the waveforms of the modified pulse.

REFERENCES

1. Bernstein M A, Huston J, Ward H A. Imaging artifacts at 3.0 T. J Magn Reson Imaging. 2006; 24(4):735-746. doi:10.1002/jmri.20698
2. Franklin Kendra M., Dale Brian M., Merkle Elmar M. Improvement in B1-inhomogeneity artifacts in the abdomen at 3 T MR imaging using a radiofrequency cushion. J Magn Reson Imaging. 2008; 27(6):1443-1447. doi: 10.1002/jmri.21164
3. J. V. Hajnal, S. J. Malik, D. J. Larkman, D. O'Regan, K. Nehrke, U. Katscher, I. Graesslin, and P. Börnert, Initial Experience with RF shimming at 3 T using a whole body 8 channel R F system, in Proceedings of the 16th Annual Meeting of ISMRM, Toronto, Ontario, Canada, 2008. p. 496.
4. Katscher U, Börnert P, Leussler C, van den Brink J S. Transmit SENSE. Magn Reson Med. 2003; 49(1):144-150. doi:10.1002/mrm.10353
5. Tomi-Tricot R, Gras V, Mauconduit F, et al. B1 artifact reduction in abdominal DCE-MRI using kT-points: First clinical assessment of dynamic RF shimming at 3 T. J Magn Reson Imaging:n/a-n/a. doi:10.1002/jmri.25908
6. Cloos M A, Boulant N, Luong M, et al. kT-points: Short three-dimensional tailored R F pulses for flip-angle homogenization over an extended volume. Magnetic Resonance in Medicine 67:72-80 (2012).
7. Gras V, Vignaud A, Amadon A, Bihan D L, Boulant N. Universal pulses: A new concept for calibration-free parallel transmission. Magn Reson Med. 2017; 77(2):635-643. doi:10.1002/mrm.26148
8. WO2017/060142
9. Raphael Tomi-Tricot, Vincent Gras, Bertrand Thirion, Franck Mauconduit, Nicolas Boulant, et al. SmartPulse, a Machine Learning Approach for Calibration-Free Dynamic RF Shimming: Preliminary Study in a Clinical Environment. Magnetic Resonance in Medicine, Wiley, 2019, Magn Reson Med., 82, pp. 2016-2031.
10. Brunheim et al., "Fast and accurate multi-channel mapping based on the TIAMO technique for 7 T UHF body MRI," Magnetic Resonance in Medicine, vol. 79, no. 5, pp. 2652-2664, 2018.
11. P. Alotto, C. Magele, W. Renhart, A. Weber, and G. Steiner, "Robust target functions in electromagnetic design," COMPEL, vol. 22, no. 3, pp. 549-560, September 2003.
12. G. Steiner, D. Watzenig, C. Magele, and U. Baumgartner, "Statistical robust design using the unscented transformation," COMPEL—The international journal for computation and mathematics in electrical and electronic engineering, vol. 24, no. 2, pp. 606-619, June 2005.
13. H.-P. Fautz, M. H. Vogel, P. Gross, A. Kerr, and Y. Zhu, "B1 mapping of coil arrays for parallel transmission," In Proceedings of the 16th Annual Meeting of ISMRM, p. 1247, 2008.
14. D. O. Brunner and K. P. Pruessmann, "B1+ interferometry for the calibration of RF transmitter arrays," Magn Reson Med, vol. 61, no. 6, pp. 1480-1488, 2009.
15. A. Amadon, M. A. Cloos, N. Boulant, M.-F. Hang, C. J. Wiggins, and H.-P. Fautz, "Validation of a very fast B1-mapping sequence for parallel transmission on a human brain at 7 T," In Proceedings of the 20th Annual Meeting of ISMRM, p. 3358, 2012.

The invention claimed is:

1. A computer-implemented method of designing a pulse sequence (P) for parallel-transmission magnetic resonance imaging, said pulse sequence comprising at least a magnetic field gradient waveform (H) and a set of radio-frequency waveforms (U), each radio-frequency waveform of said set being associated to a respective transmit channel (RFC1-RFC8) of a parallel-transmission magnetic resonance imaging apparatus, the method comprising:

a) for each one of a plurality of magnetic resonance imaging subjects, estimating a linear transformation, called adjustment transformation (L), converting amplitude maps ($\Omega_1^{(1)}$-$\Omega_1^{(1)}$) of radio-frequency fields generated within a region of interest comprising a body part of the subject by respective transmit channels of the magnetic resonance imaging apparatus into respective standardized maps, the adjustment transformation being chosen in such a way as to minimize a first cost function representative of an averaged difference between the standardized maps for the subject and respective reference amplitude maps for a reference subject; and b) determining at least said radio-frequency waveforms (U) in such a way as to minimize a second cost function representative of a discrepancy between subject-specific distributions of flip-angles of nuclear spin and a target distribution, averaged over said plurality of magnetic resonance imaging subjects, the subject-specific distributions corresponding to the flip-angle distributions achieved by applying a magnetic field gradient waveform and a superposition of radio-frequency fields, each of said radio-frequency fields having a temporal profile described by one of said radio-frequency waveforms and a spatial amplitude distribution described by a respective standardized map determined for the subject.

2. The method of claim 1, wherein step b) further comprising determining said magnetic field gradient waveform (H) so as to minimize said second cost function.

3. The method of claim 1, further comprising a preliminary step of acquiring all or some of said amplitude maps using the magnetic resonance imaging apparatus, the acquired amplitude maps being used for estimating the adjustment transformation.

4. The method of claim 1, further comprising a preliminary step of computing all or some of said amplitude maps by performing an electromagnetic simulation using a computer, the simulated amplitude maps being used for estimating the adjustment transformation.

5. The method of claim 1, further comprising a preliminary step of measuring a noise covariance matrix for a plurality of receive channels of the parallel-transmission magnetic resonance imaging apparatus, the measured noise covariance matrix being used for estimating the adjustment transformation.

6. The method of claim 1, wherein step a) further comprises computing second-order statistics of the standardized maps and step b) comprises determining at least said radio-frequency waveforms from said second-order statistics.

7. The method of claim 1, wherein the target distribution is homogeneous over a region of interest.

8. A method of performing parallel-transmission magnetic resonance imaging of a subject using a parallel-transmission magnetic resonance imaging apparatus comprising a set of gradient coils (GC), a plurality of transmit channels (RFC1-RFC8) and a plurality of receive channels, the method comprising the steps of:
   i) using the receive channels of the apparatus for performing measurements representative of spatial distributions of radio-frequency fields generated by respective transmit channels within a region of interest comprising a body part of the subject;
   ii) using results of said measurements, estimating a linear transformation (L), called adjustment transformation, converting amplitude maps of radio-frequency fields generated within the region of interest by respective transmit channels of the magnetic resonance imaging apparatus into respective standardized maps, the adjustment transformation being chosen in such a way as to minimize a cost function representative of an averaged difference between the standardized maps for the subject and respective reference amplitude maps for a reference subject;
   iii) inverting the adjustment transformation, and computing a set of subject-specific radio-frequency waveforms (P') by applying the inverted adjustment transformation to a set of predetermined reference radio-frequency waveforms; and
   iv) applying each subject-specific radio-frequency waveform to a respective transmit channel while applying a magnetic field gradient waveform to the gradient coils, and using the receive channels to receive parallel-transmission magnetic resonance imaging signals,
   wherein said set of predetermined reference radio-frequency waveforms has been obtained using a method according to claim 1.

9. A method of performing parallel-transmission magnetic resonance imaging of a subject using a parallel-transmission magnetic resonance imaging apparatus comprising a set of gradient coils (GC), a plurality of transmit channels (RFC1-RFC8) and a plurality of receive channels, the method comprising the steps of:
   i) using the receive channels of the apparatus for performing measurements representative of spatial distributions of radio-frequency fields generated by respective transmit channels within a region of interest comprising a body part of the subject;
   ii) using results of said measurements, estimating a linear transformation (L), called adjustment transformation, converting amplitude maps of radio-frequency fields generated within the region of interest by respective transmit channels of the magnetic resonance imaging apparatus into respective standardized maps, the adjustment transformation being chosen in such a way as to minimize a cost function representative of an averaged difference between the standardized maps for the subject and respective reference amplitude maps for a reference subject;
   iii) inverting the adjustment transformation, and computing a set of subject-specific radio-frequency waveforms (P') by applying the inverted adjustment transformation to a set of predetermined reference radio-frequency waveforms; and
   iv) applying each subject-specific radio-frequency waveform to a respective transmit channel while applying a magnetic field gradient waveform to the gradient coils, and using the receive channels to receive parallel-transmission magnetic resonance imaging signals.

10. The method of claim 9, wherein step i) comprises acquiring amplitude maps of said radio-frequency fields with a lower spatial resolution than that of the receive parallel-transmission magnetic resonance imaging signals acquired during step iv).

11. The method of claim 9, wherein step i) comprises measuring a noise covariance matrix for said receive channels.

12. A parallel-transmission magnetic resonance imaging apparatus comprising a set of gradient coils (GC), a plurality of transmit channels (RFC1-RFC8), a plurality of receive channels and a data processor (CP), wherein:
   it further comprises a memory device (DB) storing data defining a set of predetermined reference radio-frequency waveforms and a magnetic field gradient waveform; and in that the data processor is programmed or configured for:
driving the receive channels to perform measurements representative of spatial distributions of radio-frequency fields generated by the respective transmit channels within a region of interest comprising a body part of the subject;
using results of said measurements, estimating a linear transformation (L), called adjustment transformation, converting amplitude maps of radio-frequency fields generated within the region of interest by respective transmit channels into respective standardized maps, the adjustment transformation being chosen in such a way as to minimize a cost function representative of an averaged difference between the standardized maps for the subject and respective reference amplitude maps for a reference subject;
inverting the adjustment transformation and computing a set of subject-specific radio-frequency waveforms by applying the inverted adjustment transformation to a set of predetermined reference radio-frequency waveforms; and
driving the transmit channels to play respective subject-specific radio-frequency waveforms, the gradient coils to play a magnetic field gradient waveform and the receive coil to receive parallel-transmission magnetic resonance imaging signals.

* * * * *